United States Patent [19]

Ekdahl

[11] Patent Number: 4,710,590
[45] Date of Patent: Dec. 1, 1987

[54] SEALING DEVICE IN METAL CABINETS, WHICH SCREENS OFF ELECTRO-MAGNETIC FIELDS

[75] Inventor: Per A. A. Ekdahl, Järfälla, Sweden

[73] Assignee: Telefonaktiebolaget LM Ericsson, Stockholm, Sweden

[21] Appl. No.: 843,700

[22] PCT Filed: May 24, 1985

[86] PCT No.: PCT/SE85/00219
§ 371 Date: Jan. 23, 1986
§ 102(e) Date: Jan. 23, 1986

[87] PCT Pub. No.: WO86/00491
PCT Pub. Date: Jan. 16, 1986

[30] Foreign Application Priority Data

Jun. 18, 1984 [SE] Sweden .............................. 84032507

[51] Int. Cl.⁴ ............................................. H05K 9/00
[52] U.S. Cl. ................................ 174/35 GC; 292/202; 174/35 MS
[58] Field of Search ..................... 174/35 GC, 35 MS; 49/394; 292/202; 219/10.55 D

[56] References Cited

U.S. PATENT DOCUMENTS 3,277,230 10/1966 Stickney et al. ............... 174/35 GC
3,281,177 10/1966 Tenenbaum ........................ 292/241
3,962,550 6/1976 Kaiserwerth .................. 174/35 MS
4,207,706 6/1980 Haines .................................. 49/141

FOREIGN PATENT DOCUMENTS 2609848 10/1976 Fed. Rep. of Germany .
487463 6/1938 United Kingdom .

OTHER PUBLICATIONS

EMI/RFI Shielding, p. 2, Tecknit Catalog 8565-69, 1969.

Primary Examiner—A. T. Grimley
Assistant Examiner—Kathleen Heimiller
Attorney, Agent, or Firm—Roberts, Spiecens & Cohen

[57] ABSTRACT

A sealing device in metal cabinets, which are used to screen off electromagnetic fields, for compressing metallic gaskets along the edges of its door. The device includes an elongate element (3,5,18) the length of which conforms with that of the door (1,2) and which is pivotable about an axis (7) parallel to the pivoting axis of the door. At its pivoting axis (7) the element is provided with a first elongate contact surface (10) which presses against the gasket (12) with a leverage effect when the element is turned to one end position. A second elongate contact surface (8) disposed on the element simultaneously engages against an abutment (9,16) to prevent the door from warping due to the pressure applied against the gasket.

10 Claims, 6 Drawing Figures

U.S. Patent  Dec. 1, 1987  Sheet 1 of 2  4,710,590
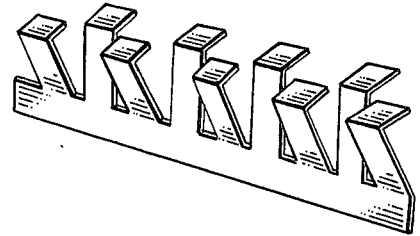
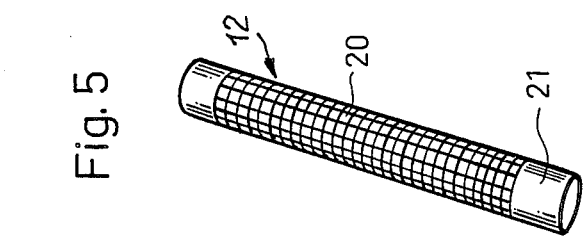
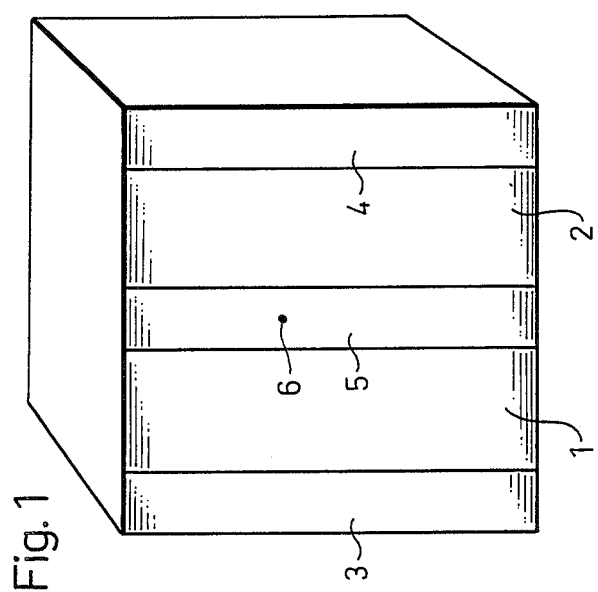
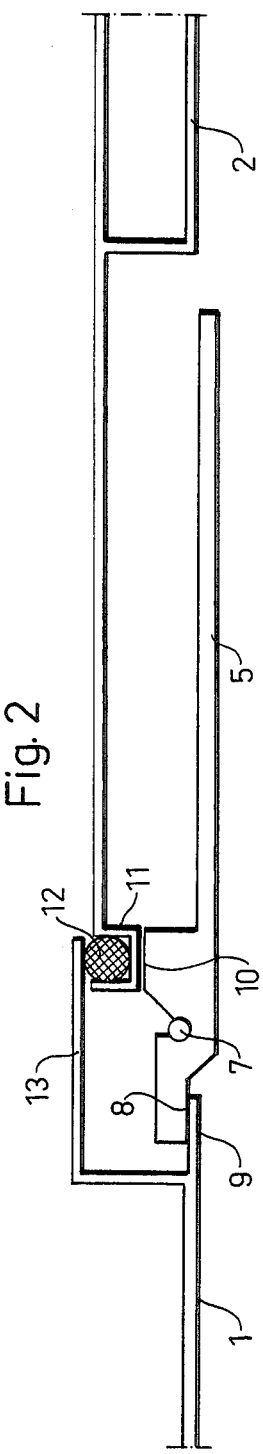

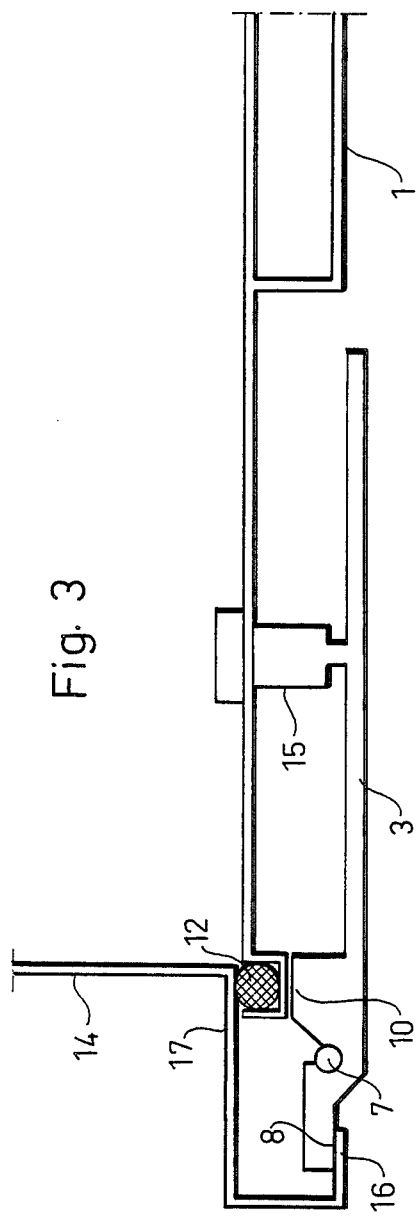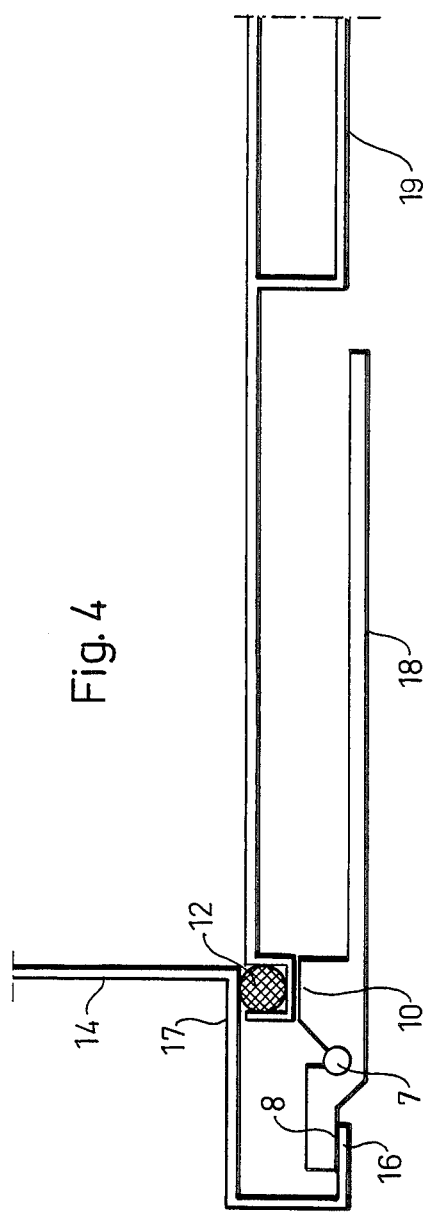

SEALING DEVICE IN METAL CABINETS, WHICH SCREENS OFF ELECTRO-MAGNETIC FIELDS

FIELD OF THE INVENTION

The invention relates to a sealing device in metal cabinets used as screens against electromagnetic fields, for compressing metallic gaskets along the edges of the door.

Electromagnetic fields occur in nature as well as caused by electric and electronic equipment. The fields can disturb the function of other electronic equipment, and the increased use of such equipment has resulted in increasing interference or disturbance problems. Electromagnetic fields can be prevented from coming into, or departing from, electronic equipment by building such equipment into closed metallic casings.

BACKGROUND

A problem in the construction of a cabinet for electronic equipment, a so-called apparatus cabinet, is to provide an effective seal at the door of the cabinet.

A previously proposed method of achieving such a seal is to construct the door and frame so that these can abut each other with metallic contact around the entire frame. This method puts great demands on tolerances in manufacture, however.

Another known method is to use a metallic sealing strip along the edges of the door. Problems occur here, however, caused by large stresses on the door suspension means and by the door having a tendency to warp.

Irrespective of the method applied, there is still a further problem in achieving an effective seal between left and right doors of a two door cabinet.

SUMMARY OF THE INVENTION

The object of the present invention is to provide a sealing device which can be used at the joint between the door and a door frame as well as at the joint between two doors.

The object is achieved by a pivotable elongate element which, on being turned to one end position for a closed door causes a metal gasket to be compressed without the door warping or without its suspension means being appreciably loaded.

The invention is characterized by the construction of a sealing device for a metal cabinet for screening electromagnetic fields comprising first and second adjacent elements, one of which is a door which is pivotably movable around a pivot axis between open and closed positions relative to the other of the elements and wherein a compressible metallic gasket is supported on an edge of the door which faces said other element and which moves towards and away from said other element when the door travels between its open and closed positions. An elongate element is disposed adjacent said edge of said door and is substantially coextensive in length therewith, said elongate element being supported by a hinge for undergoing pivotal movement about an axis parallel to the pivot axis of the door. The elongate element has first and second elongate contact surfaces so disposed that when the elongate element is pivoted in one direction about its hinge axis relative to said other element, said first elongate contact surface applies pressure to compress said gasket with increased leverage effect while said second elongate contact surface applies counterpressure against said other element to prevent the door from warping due to the pressure applied on the gasket.

BRIEF DESCRIPTION OF THE DRAWINGS

The invention will now be described in detail with reference to the accompanying drawings, in which:

FIG. 1, illustrates, in perspective, an apparatus cabinet;

FIG. 2 is a sectional view which illustrates a joint between two doors of the cabinet, FIG. 3 is a sectional view which illustrates a joint between the door and the door frame at the door suspension means;

FIG. 4 is a sectional view which illustrates a joint between the closure edge of a door frame in a cabinet with only one door;

FIG. 5 is a perspective view which illustrates an embodiment of a gasket located in these joints; and FIG. 6 is a perspective view of another embodiment of a gasket.

DETAILED DESCRIPTON OF A BEST MODE FOR CARRYING OUT THE INVENTION

The apparatus cabinet according to FIG. 1 is provided with two doors 1 and 2. Elongate elements 3, 4 and 5 are attached to the doors and extend parallel to the pivotal axes of the doors. Elements 3 and 4 are rigidly attached to the doors by fastening means, for example, screw joints, while the element 5 is pivotable in relation to the doors. A restraining means 6 may be used to keep the element 5 in an end position.

FIG. 2 illustrates the elongate element 5 in cross-section, and how it achieves an effective seal between the doors 1 and 2. The element 5 is hinged at one side by pivotal pins 7. These pins are fixed in the upper and in the lower edge portions of door 2, adjacent its vertical edge, and may be rather short. In the vicinity of its pivoting axis, the element 5 has an inwardly directed elongate contact surface 10. When the element is turned around pins 7 to the illustrated end position by manually pushing against the element 5, the surface 10 is intended to engage against the outside of a trough-like projection 11 extending out from the door 2 and containing a metallic and compressible gasket 12. When the doors are closed, this gasket engages against an abutment 13 at the vertical edge portion of the door 1, this portion having a U-shaped cross-section, so that when the element 5 is turned to its end position pressure is exerted against the projection 11 and thereby on the gasket 12. An elongate contact surface 8 on the element, facing away from the surface 10, is intended to engage against a second abutment 9 at the edge portion of the door 1.

A uniformly distributed pressure is provided along the entire gasket with the described device, and thereby effective sealing of the joint between both doors is obtained. This is because the gasket is compressed with relatively large pressure, due to the leverage effect of the element 5, which takes place without appreciable load on the pins 7 on which the element 5 is hung and without the doors warping.

The doors are retained in a closed position by the restraining means 6, not illustrated in FIG. 2, which may be an ordinary sliding bolt, and by which the element 5 can be restrained in the illustrated end position and by the horizontal parts of the door frame being provided with unillustrated abutments pressing against the surface 8.

When the doors are to be opened, the element 5 must first be turned outwards, after which the door 2 can be opened, and then the door 1.

FIG. 3 illustrates how the sealing device is used in a joint between a door and a door frame. The door in FIG. 3 corresponds to door 1, with the elongate element 3 attached to it. The element 3, which functions as a hinge for the door is pivotably mounted on the door frame, and is rigidly attached to the door by fastening means 15, for example, a screwed joint. The element 3 otherwise corresponds to the element 5 previously described, except that it lacks restraining means 6. For a closed door, the gasket 12 is pressed against an abutment 17 in an edge portion of the door frame of U-shaped cross-section, and the surface 8 is pressed against a second abutment 16 in the edge portion.

Effective sealing of a closed door is also achieved by this joint, due to the relatively large pressure, uniformly distributed along the gasket, which causes the gasket to be compressed. This takes place without the pins on which the door is hung from being appreciably loaded and without the door warping.

FIG. 4 illustrates how the seal can be used for the joint between the closure edge of a door 19 and the door frame in a cabinet with only one door. The hinge of the door 19 is located far to the right and is not visible in FIG. 4. An elongate element 18 of the same construction as the element 5 is pivotably suspended in the door adjacent the door frame which, as previously is denoted by numeral 14. The seal is achieved as in the joint according to FIG. 3, but with the difference that the element 18 is not rigidly attached to the door. As was the case with the elongate element 5 according to FIG. 2 the element 18 is also provided with an unillustrated restraining means, by which th element 18 can be kept in the illustrated end position with the door closed.

The horizontal edges of the doors or the door of a cabinet are in general much shorter than the vertical edges, whereby the gaskets along the horizontal edges can be compressed without the doors warping.

Different embodiments of the metallic gasket 12 are illustrated in FIGS. 5 and 6. According to FIG. 5 the gasket consists of woven metallic net 20 around an elongate elastic core 21 having a round cross-section.

According to FIG. 6, the gasket consists of a comb-like plate, the teeth of which are bent at its ends and have different slopes so that the gasket can fill an elongate space.

Depending on the sealing capacity desired, the gasket can be made from different metals.

What is claimed is:

1. A sealing device for a metal cabinet for screening electromagnetic fields comprising first and second adjacent elements, one of said elements being a pivotable door which is pivotably movable around a pivot axis between open and closed positions relative to the other of said elements, a compressible metallic gasket, said door having an edge facing said other element which supports said gasket and which moves towards and away from said other element when the door travels between said open and closed positions, an elongate element disposed adjacent said edge of said door and substantially coextensive in length therewith, hinge means supporting said elongate element for pivotal movement about an axis parallel to the pivot axis of the door, said elongate element having first and second elongate contact surfaces so disposed that when the elongate element is pivoted in one direction about its hinge axis relative to said other element said first elongate contact surface applies pressure to compress said gasket with increased leverage effect while said second elongate contact surface applies counterpressure against said other element to prevent the door from warping due to the pressure applied on the gasket, said hinge means being located between said first and second elongate contact surfaces such that the hinge means is not substantially loaded when the elongate contact surfaces apply the pressure and counterpressure respectively.

2. A sealing device as claimed in claim 1 wherein said other element includes an elongated projection which forms an abutment for said second elongate contact surface of said elongate element.

3. A sealing device as claimed in claim 2 comprising removable restraining means for holding said door in said closed position.

4. A sealing device as claimed in claim 1 comprising means fixedly connecting said door and said elongate element for common pivotal movement around said hinge means, the pivot axis of the door being coincident with the pivot axis of the hinge means.

5. A sealing device as claimed in claim 1 wherein said gasket comprises an elastic core and a metallic net surrounding said core.

6. A sealing device as claimed in claim 1 wherein said gasket means comprises a metal comb element including teeth having bent ends, said teeth being arranged in at least two groups whose teeth extend at different angles.

7. A sealing device as claimed in claim 1 wherein said other element has a U-shape section facing said door edge and said elongate element, said U-shape section having opposed facing surfaces which are respectively contacted by said gasket and said second elongate surface of said elongate element.

8. A sealing device as claimed in claim 1 wherein in said closed position of said door said first contact surface abuts against said edge of said door to press said gasket against said other element while said second contact surface abuts against said other element.

9. A sealing device as claimed in claim 8 wherein the contact of the gasket with the other element and the abutment of the second contact surface with the other element take place on opposite sides of the hinge axis.

10. A sealing device as claimed in claim 1 wherein said contact surfaces face in substantially opposite directions.

* * * * *